(12) United States Patent
Sakura

(10) Patent No.: US 8,610,237 B2
(45) Date of Patent: Dec. 17, 2013

(54) SEMICONDUCTOR APPARATUS

(75) Inventor: Naoki Sakura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/553,150

(22) Filed: Jul. 19, 2012

(65) Prior Publication Data

US 2013/0062788 A1    Mar. 14, 2013

(30) Foreign Application Priority Data

Sep. 9, 2011   (JP) .................................. 2011-196644

(51) Int. Cl.
  *H01L 21/70* (2006.01)
  *H01L 23/495* (2006.01)
(52) U.S. Cl.
  USPC ........... 257/500; 257/107; 257/159; 257/501; 257/502; 257/632; 257/668; 257/E33.066; 257/E23.031
(58) Field of Classification Search
  USPC ......... 257/666, 668, 107, 159, 632, 500–502, 257/E33.066, E23.031
  See application file for complete search history.

(56) References Cited

U.S. PATENT DOCUMENTS 5,946,556 A    8/1999   Hashizume
6,680,533 B1   1/2004   Miyazawa

FOREIGN PATENT DOCUMENTS

| JP | 63-132459 | 6/1988 |
| JP | 5-281231 | 8/1993 |
| JP | 3132449 | 11/2000 |
| JP | 3328542 | 7/2002 |
| JP | 3612268 | 10/2004 |
| JP | 3825874 | 7/2006 |

*Primary Examiner* — Michelle Mandala
(74) *Attorney, Agent, or Firm* — McDermott Will & Emery LLP

(57) ABSTRACT

A semiconductor apparatus includes a semiconductor chip, a lead frame that has a first surface having the semiconductor chip mounted thereover and a second surface opposite to the first surface, a bonding wire that couples the semiconductor chip and the lead frame, and a high dielectric constant layer that is disposed over a surface of the lead frame opposite to a surface having the semiconductor chip mounted thereover and that has a relative permittivity of 5 or more. The lead frame includes a source electrode lead coupled to the source of a semiconductor device formed over the semiconductor chip and a source-wire junction at which the source electrode lead and the bonding wire are coupled together. The high dielectric layer is disposed in a region including at least a position corresponding to the source-wire junction over the second surface of the lead frame.

8 Claims, 16 Drawing Sheets

SEMICONDUCTOR APPARATUS

CROSS-REFERENCE TO RELATED APPLICATIONS

The disclosure of Japanese Patent Application No. 2011-196644 filed on Sep. 9, 2011 including the specification, drawings, and abstract is incorporated herein by reference in its entirety.

BACKGROUND

The present invention relates to a semiconductor apparatus and in particular to a semiconductor apparatus including a semiconductor chip over which an amplifier circuit for amplifying high-frequency signals is formed.

Radio signal systems include an amplifier circuit for handling high-frequency signals in a microwave band. Among examples of such an amplifier circuit is a field-effect transistor (FET) including a GaAs substrate. Such an FET including a GaAs substrate will be referred to as a GaAsFET. A semiconductor apparatus that handles such high-frequency signals requires a technology that reduces a parasitic capacitance related to a semiconductor chip to improve high-frequency characteristics. Technologies for reducing a parasitic capacitance attributable to a package are disclosed in Japanese Patent No. 3132449 and Japanese Unexamined Patent Publication No. Hei 5 (1993)-218231. These technologies reduce a parasitic capacitance adjacent to a semiconductor chip to improve high-frequency characteristics, by incorporating a GaAsFET into a hollow package.

Japanese Patent No. 3132449 also discloses as a second embodiment a technology that incorporates a semiconductor chip and an external device associated with the semiconductor chip into a single package. Another example of such an embodiment is disclosed in Japanese Unexamined Patent Publication No. Sho 63 (1988)-132459. In a semiconductor apparatus disclosed in Japanese Unexamined Patent Publication No. Sho 63 (1988)-132459, a bypass capacitor disposed is disposed below a semiconductor chip and between a ground terminal and a power supply terminal for supplying power to a circuit formed over the semiconductor chip. The bypass capacitor is interposed between lead frames.

In the meantime, where an FET is used to form an amplifier circuit for amplifying high-frequency signals, the FET is used to form a source ground circuit. At this time, the FET is formed over a semiconductor chip and coupled to an external circuit via a bonding wire and a lead frame. For this reason, inductance components attributable to the bonding wire and the lead frame are added to the terminals of the mounted FET as parasitic components. Such inductance components have high impedance in a high-frequency band and therefore would cause a reduction in the amplification factor of the amplifier circuit in a high-frequency band. For this reason, there is a need for a technology that reduces the impedance of a ground terminal for handling high-frequency signals. Examples of a semiconductor apparatus for handling high-frequency signals are disclosed in Japanese Patent Nos. 3328542, 3612268, and 3825874.

These technologies form a series resonant circuit for reducing inductance components of the source (ground electrode) of an FET. Using the series resonant circuit, the technologies reduce the impedance of the source terminal of the FET in a high-frequency band to improve high-frequency characteristics.

SUMMARY

Unfortunately, the technologies using a series resonant circuit disclosed in Japanese Patent Nos. 3328542, 3612268, and 3825874 would degrade the stability of the amplifier circuit at frequencies other than the intended frequency, although they can reduce the impedance of the FET at a particular frequency. For example, an amplifier circuit including a series resonant circuit would disadvantageously cause parasitic oscillation at frequencies other than the intended frequency.

That is, unfortunately, these related art examples cannot obtain good frequency characteristics in a wide frequency band while maintaining the stability of the amplifier circuit in the wide frequency band.

A semiconductor apparatus according to an aspect of the present invention includes a semiconductor chip, a lead frame that has a first surface having the semiconductor chip mounted thereover and a second surface opposite the first surface, a bonding wire coupling the semiconductor chip and the lead frame, and a high-dielectric layer that is disposed over a surface of the lead frame opposite to a surface thereof having the semiconductor chip mounted thereover and that has a relative permittivity of 5 or more. The lead frame includes a source electrode lead coupled to the source of a semiconductor device formed over the semiconductor chip and a source-wire junction at which the source electrode lead and the bonding wire are coupled together. The high-dielectric layer is disposed in a region including at least a position corresponding to the source-wire junction over the second surface of the lead frame.

The semiconductor apparatus according to the aspect of the present invention has the high-dielectric layer in a region including at least a position corresponding to the source-wire junction over the second surface of the lead frame. Thus, in the semiconductor apparatus according to the aspect of the present invention, a capacitor coupled in parallel to parasitic inductance components of the lead frame can be formed using this high-dielectric layer. By using the capacitor formed using the high-dielectric layer, the semiconductor apparatus according to the aspect of the present invention can control an increase in impedance of the source terminal attributable to parasitic inductance components in a high-frequency band.

The semiconductor apparatus according to the aspect of the present invention can obtain good frequency characteristics in a wide frequency band while maintaining the stability of the amplifier circuit in the wide frequency band.

DETAILED DESCRIPTION

Figure 1:
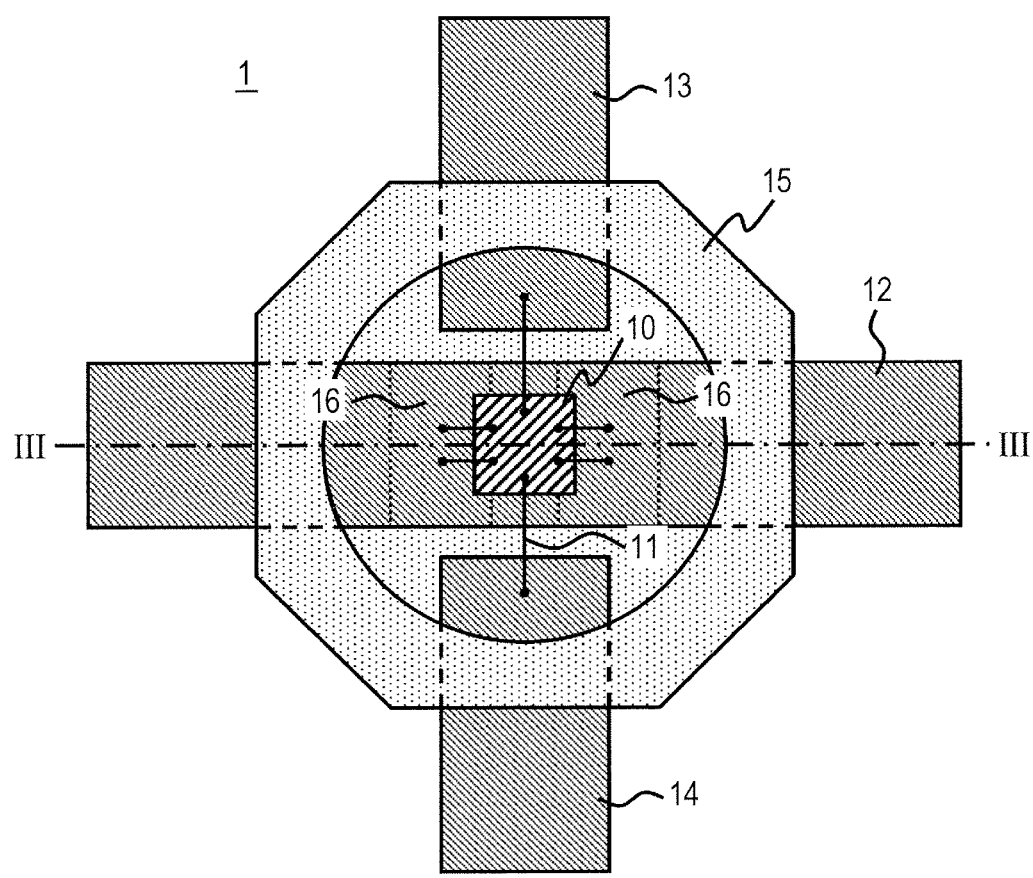
FIG. 1 is a top view of a semiconductor apparatus according to a first embodiment.

Embodiments of the present invention will be described with reference to the accompanying drawings. FIG. 1 is a top view of a semiconductor apparatus 1 according to a first embodiment. While the semiconductor apparatus 1 includes a cap covering semiconductor chips, the cap is excluded in the top view of FIG. 1 so as to show the semiconductor chips.

As shown in FIG. 1, the semiconductor apparatus 1 according to the first embodiment includes a semiconductor chip 10, bonding wires 11, a lead frame, a resin mold 15, and high-dielectric layers 16. The semiconductor apparatus 1 according to the first embodiment also includes a cap (not shown in FIG. 1). In FIG. 1, the lead frame which is covered by the resin mold 15 and thus cannot be recognized visually is represented by a broken line.

The lead frame includes a source electrode lead 12, a drain electrode lead 13, and a gate electrode lead 14. The semiconductor chip 10 is disposed over the source electrode lead. The semiconductor apparatus 1 according to the first embodiment has a GaAsFET formed over the semiconductor chip 10. The source of this GaAsFET is coupled to the source electrode lead 12, the drain thereof to the drain electrode lead 13, and the gate thereof to the gate electrode lead 14 via the corresponding bonding wires 11, respectively.

In the semiconductor apparatus 1 according to the first embodiment, the resin mold 15 is formed so as to cover part of the lead frame. The resin mold 15 has an aperture for exposing at least the semiconductor chip 10 and a region including a source-wire junction, of the source electrode lead. The resin mold 15 is made of a material having a permittivity higher than the high-dielectric layer 16.

The high-dielectric layers 16 are disposed in a region including at least a point corresponding to the source-wire junction over the back surface of the source electrode lead. For this reason, the high-dielectric layers 16 cannot be recognized visually in the top view shown in FIG. 1. Accordingly, the region in which the high-dielectric layers 16 are disposed is shown by a dotted line. The source-wire junctions are positions, at which a bonding wire for coupling the source electrode of the GaAsFET and the source electrode lead 12, of the bonding wires 11 is coupled to the source electrode lead 12.

Figure 2:
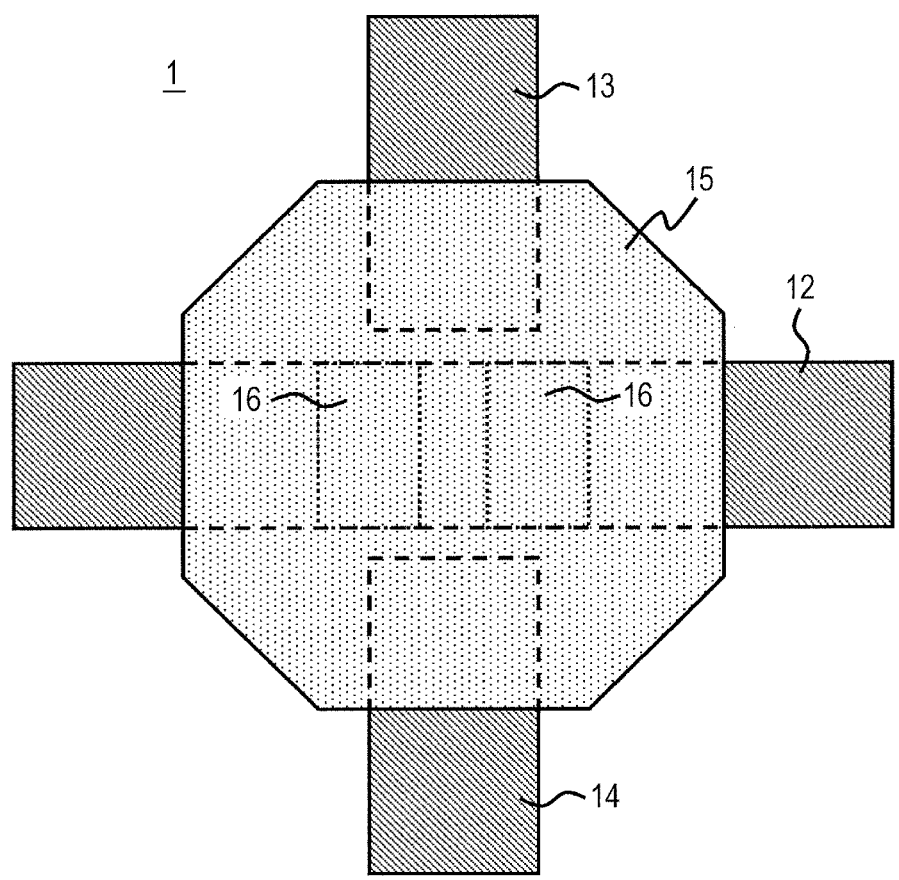
FIG. 2 is a bottom view of the semiconductor apparatus according to the first embodiment.

FIG. 2 shows a bottom view of the semiconductor apparatus 1 according to the first embodiment. As shown in FIG. 2, when seen from the bottom surface, the semiconductor apparatus 1 according to the first embodiment is covered by the resin mold 15 except for outer lead portions coupled to the mounting substrate, of the lead frame. While the high-dielectric layers 16 are disposed over the bottom surface of the semiconductor package in the semiconductor apparatus 1, they cannot be recognized visually in the bottom view shown in FIG. 2. In FIG. 2, the region in which the high-dielectric layers 16 are disposed is represented by a dotted line. In FIG. 2 also, the lead frame which is covered by the resin mold 15 and thus cannot be recognized visually is represented by a broken line.

Figure 3:
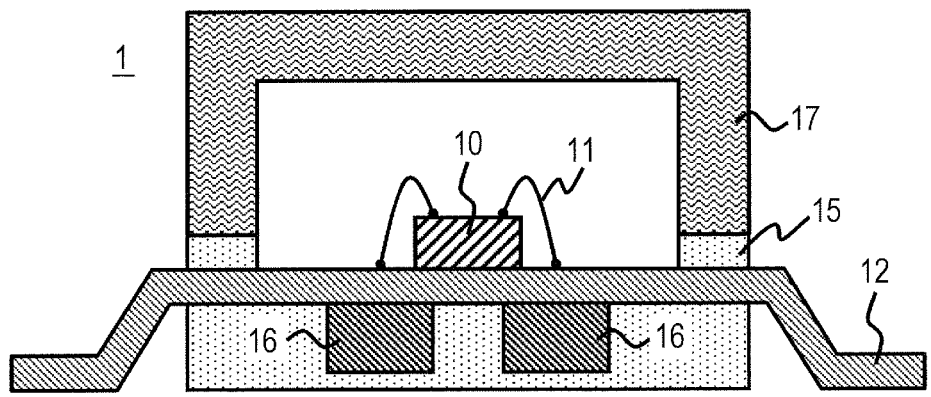
FIG. 3 is a sectional view of the semiconductor apparatus according to the first embodiment.

FIG. 3 shows a sectional view of the semiconductor apparatus 1 taken along line III-III shown in FIG. 1. As shown in FIG. 3, the semiconductor apparatus 1 according to the first embodiment has the semiconductor chip 10 disposed over the source electrode lead 12. The high-dielectric layers 16 are disposed over the surface opposite to the surface of the source electrode lead 12 having the semiconductor chip 10 mounted thereon. Hereafter, of the surfaces of the source electrode lead 12, the surface having the semiconductor chip 10 disposed thereover will be referred to as a front surface, and the surface having the high-dielectric layers 16 disposed thereover as a back surface. Further, in the semiconductor apparatus 1, pads to be coupled to the source of the GaAsFET are formed over the opposite two sides of the semiconductor chip 10. For this reason, the sectional view of FIG. 3 shows two bonding wires 11 coupling the source of the GaAsFET to the source electrode lead 12. Hereafter, the junction at which one of the two bonding wires is coupled to the source electrode lead 12 will be referred to as a first source-wire junction, and the junction at which the other boding wire is in junction therewith as a second source-wire junction. In an example shown in FIG. 3, high-dielectric layers 16 are disposed in positions corresponding to the first and second source-wire junctions. Of the high-dielectric layers 16, the one corresponding to the first source-wire junction will be referred to as a first high-dielectric layer, and the one corresponding to the second source-wire junction as a second high-dielectric layer.

The resin mold 15 is formed so as to cover the back surface of the source electrode lead 12 as well as parts of the front surface thereof. In the example shown in FIG. 3, the resin mold 15 is formed so as to cover the high-dielectric layers 16. Alternatively, the resin mold 15 may be formed in such a manner that the high-dielectric layers 16 are exposed.

As shown in FIG. 3, in the semiconductor apparatus 1, the source electrode lead 12 is bent so that edges thereof are at the same level as the bottom surface of the resin mold 15. Although not shown in FIG. 3, the drain electrode lead 13 and the gate electrode lead 14 are also bent so that edges thereof are at the same level as the bottom surface of the resin mold 15.

As shown in FIG. 3, the semiconductor apparatus 1 includes a cap 17. The cap 17 is formed so as to cover the cap 17. The cap 17 is made of a resin material having a permittivity lower than the high-dielectric layer 16.

Figure 4:
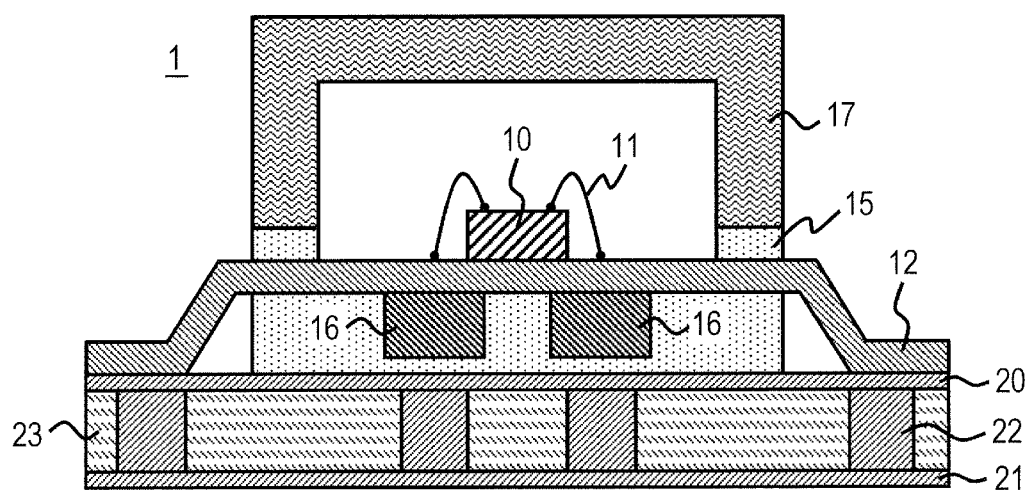
FIG. 4 is a sectional view of the semiconductor apparatus according to the first embodiment which is mounted over a substrate.

FIG. 4 shows a sectional view of the semiconductor apparatus 1 according to the first embodiment which is mounted over a substrate. As shown in FIG. 4, a substrate 23 having the semiconductor apparatus 1 according to the first embodiment mounted thereon includes first source wiring 20 and second source wiring 21 and has through holes 22. The first source wiring 20 is formed as a surface having the semiconductor apparatus 1 disposed thereover. The first source wiring 20 is formed as continuous wiring extending below the high-dielectric layers 16 and the two source electrode leads 12 of the semiconductor apparatus 1, as well as extending to the junctions of the source electrode lead 12 with the substrate 23. The second source wiring 21 is formed over a surface (e.g., the back surface) of the substrate 23 opposite to the surface having the semiconductor apparatus 1 disposed thereover. The through holes 22 are holes passing through the substrate 23 and electrically couples the first source wiring 20 and the second source wiring 21. The through holes 22 are formed below the regions where the source electrode lead 12 and the first source wiring 20 are coupled together, as well as below the high-dielectric layers 16.

Figure 5:
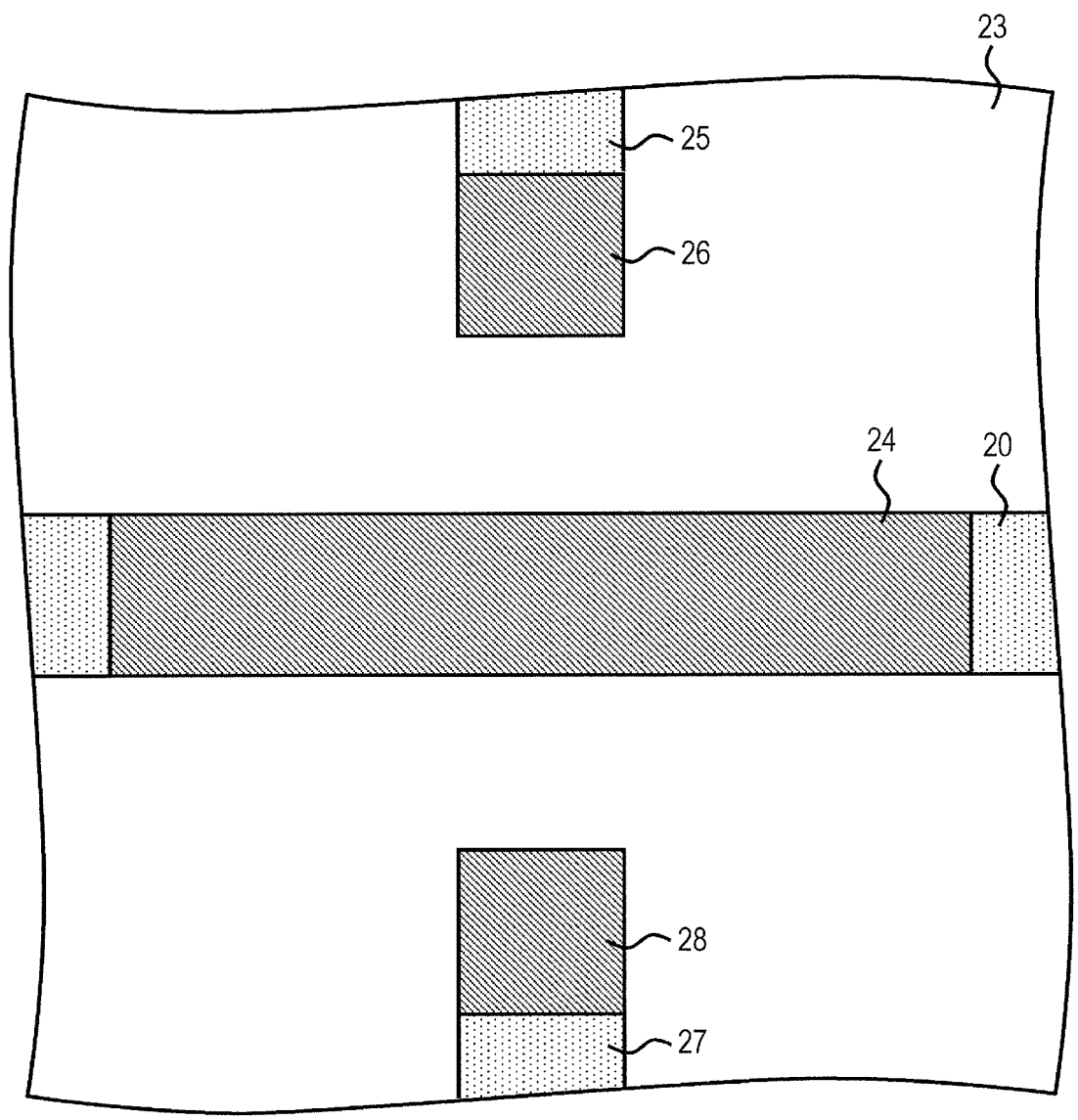
FIG. 5 is a diagram showing a foot pattern formed over the substrate over which the semiconductor apparatus according to the first embodiment is to be mounted.

A foot pattern formed over the substrate 23 having the semiconductor apparatus 1 according to the first embodiment mounted thereon will be described. FIG. 5 shows a foot pattern formed over the substrate 23 over which the semiconductor apparatus 1 is to be mounted. As shown in FIG. 5, the first source wiring 20, a drain wiring 25, and a gate wiring 27 are formed over the surface of the substrate 23. A foot pattern 24 for source terminal is formed in a continuous region extending to two positions, over which the two wire leads of the semiconductor apparatus 1 are to be disposed, of the first source wiring 20. Formed at an edge of the drain wiring 25 is a foot pattern 26 for drain terminal having a shape corresponding to the drain electrode lead 13. Formed at an edge of gate wiring 27 is a foot pattern 28 for gate terminal having a shape corresponding to the gate electrode lead 14. The region of the surface of the substrate 23 other than the foot pattern 24 for source terminal, the foot pattern 26 for drain terminal, and the foot pattern 28 for gate terminal is covered with an insulating resist. Solder paste, for example, is applied to the foot pattern 24 for source terminal, the foot pattern 26 for drain terminal, and the foot pattern 28 for gate terminal.

The foot pattern 24 for source terminal, the foot pattern 26 for drain terminal, and the foot pattern 28 for gate terminal are formed in positions corresponding to the source electrode lead 12, the drain electrode lead 13, and the gate electrode lead 14 so as to have shapes corresponding thereto.

Materials for the semiconductor chip 10, the lead frame, the resin mold 15, the high-dielectric layers 16, and the cap 17 included in the semiconductor apparatus 1 according to the first embodiment will be described in detail. The semiconductor chip 10 is a GaAsFET formed in a surface of a GaAs substrate. Forming a GaAsFET over a GaAs substrate allows a GaAsFET having a high operating band to be formed. The lead frame is made of, e.g., a copper alloy.

The resin mold 15 and the cap 17 are made of, e.g., a resin including $SiO_2$ particles as a main ingredient. This type of resin is obtained by solidifying $SiO_2$ particles using an epoxy resin or phenol resin. The resin mold 15 and the cap 17 including $SiO_2$ as a main ingredient have a relative permittivity of about 4.

The high-dielectric layers 16 can be made of, e.g., ceramic including $Al_2O_3$ as a main ingredient. The high-dielectric layers 16 including $Al_2O_3$ as a main ingredient have a relative permittivity of about 10. The high-dielectric layers 16 may be made of other materials, as long as they have a relative permittivity higher than the resin mold 15 and the cap 17. If barium titanate ($BaTiO_3$), for example, is used, the relative permittivity can be increased to about 1200. If titanium oxide ($TiO_2$), for example, is used, the relative permittivity can be increased to about 80 to about 183.

Next, a method for manufacturing the semiconductor apparatus 1 according to the first embodiment will be described. FIGS. 6 to 9 are sectional views corresponding to manufacturing processes of the semiconductor apparatus 1. These sectional views correspond to the sectional view shown in FIG. 3.

Figure 6:
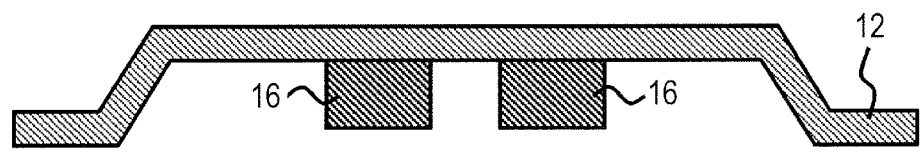
FIG. 6 is a sectional view showing a first manufacturing process of the semiconductor apparatus according to the first embodiment.

FIG. 6 shows a first manufacturing process of the semiconductor apparatus 1. As shown in FIG. 6, in the first manufacturing process, high-dielectric chips to serve as the high-dielectric layers 16 are bonded to the back surface of the bent lead frame. These high-dielectric chips are bonded to the positions over the back surface of the source electrode lead 12 corresponding to the first and second source-wire junctions over the front surface thereof. The adhesive may be silver paste or the like. Note that the adhesive need not necessarily be conductive.

Figure 7:
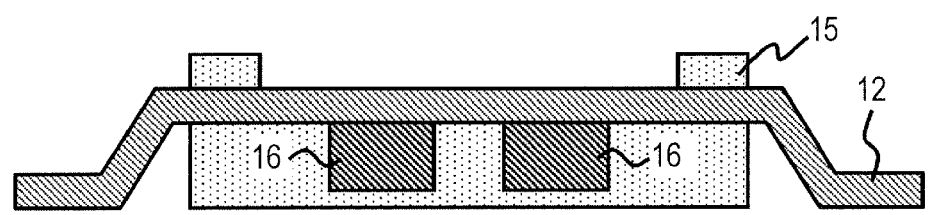
FIG. 7 is a sectional view showing a second manufacturing process of the semiconductor apparatus according to the first embodiment.

FIG. 7 shows a second manufacturing process of the semiconductor apparatus 1. As shown in FIG. 7, in the second manufacturing process, the resin mold 15 is formed so as to cover the high-dielectric layers 16 over the back surface of the lead frame and so as to cover parts of the front surface of the lead frame. At this time, the resin mold 15 is formed so as to cover parts of the front surface of the lead frame, as well as so as to form an aperture for exposing a portion of the lead frame having the semiconductor chip 10 mounted thereover and portions thereof to which boding wires are to be coupled. Further, the resin mold 15 is formed in such a manner that the bottom surface thereof and the bottom surface of the lead frame are at the same level.

Figure 8:
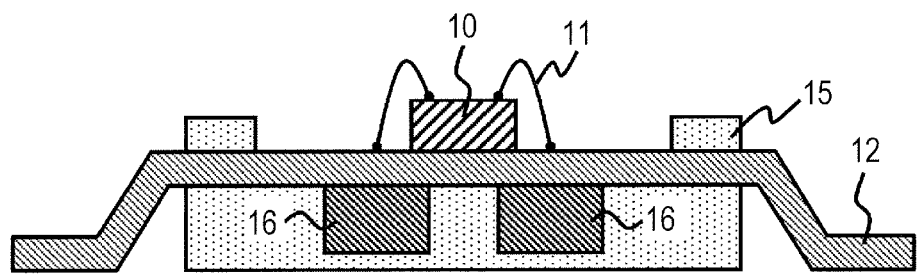
FIG. 8 is a sectional view showing a third manufacturing process of the semiconductor apparatus according to the first embodiment.

FIG. 8 shows a third manufacturing process of the semiconductor apparatus 1. As shown in FIG. 8, in the third manufacturing process, the semiconductor chip 10 is mounted over the source electrode lead 12. At this time, the semiconductor chip 10 is fixed to the source electrode lead 12 using a conductive adhesive such as silver paste. In the third manufacturing process, a first coupling pad coupled to the source of a GaAsFET formed over the semiconductor chip 10 and the source electrode lead 12 are coupled by the bonding wire 11. A second coupling pad coupled to the drain of the GaAsFET formed over the semiconductor chip 10 and the drain electrode lead 13 are coupled by the bonding wire 11. A third coupling pad coupled to the gate of the GaAsFET formed over the semiconductor chip 10 and the gate electrode lead 14 are coupled by the bonding wire 11. Note that the second and third coupling pads are not shown in FIG. 8.

Figure 9:
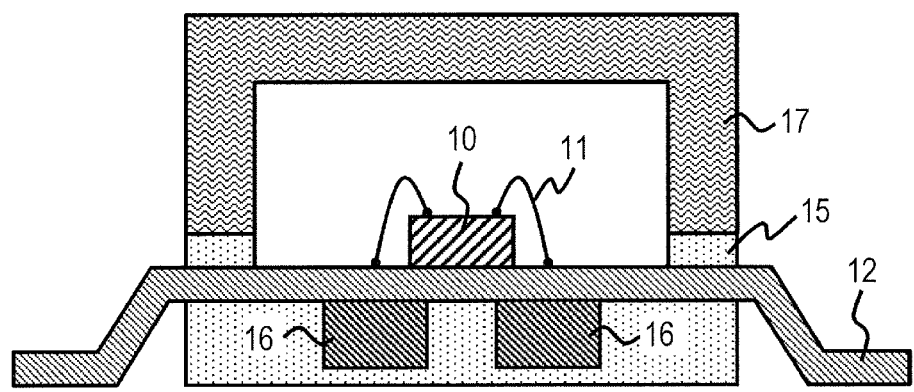
FIG. 9 is a sectional view showing a fourth manufacturing process of the semiconductor apparatus according to the first embodiment.

FIG. 9 shows a fourth manufacturing process of the semiconductor apparatus 1. As shown in FIG. 9, in the fourth manufacturing process, the cap 17 is disposed over the resin mold 15 so as to hermetically seal the resin mold 15. Thus, the semiconductor chip 10 is covered with the cap 17.

Figure 10:
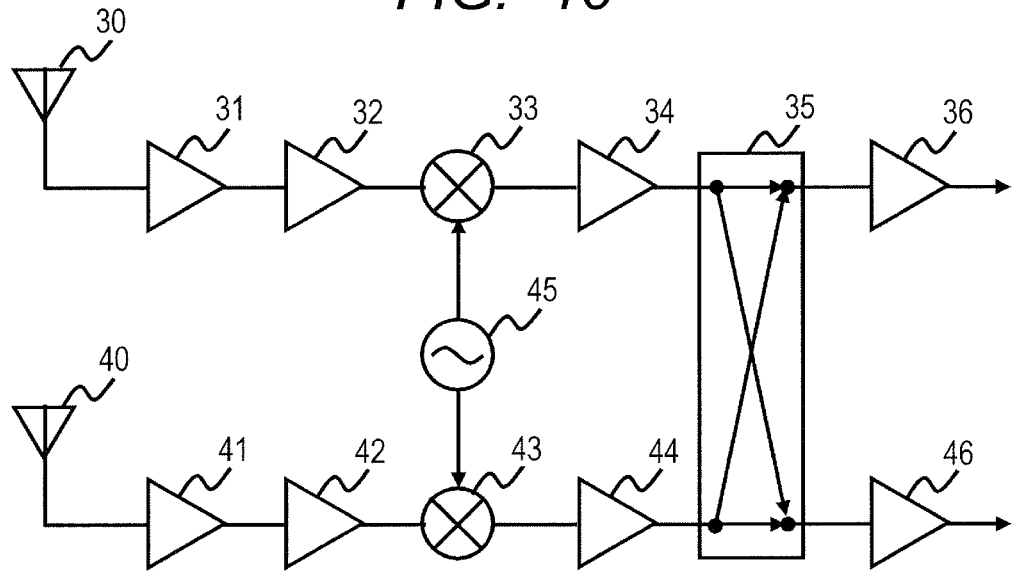
FIG. 10 is an example of a communication system including the semiconductor apparatus according to the first embodiment.

Next, a communication system including the semiconductor apparatus 1 according to the first embodiment and characteristics of the semiconductor apparatus 1 will be described. FIG. 10 is a block diagram of a communication system including the semiconductor apparatus 1 according to the first embodiment. The communication system shown in FIG. 10 is an example of a communication system including the semiconductor apparatus 1 according to the first embodiment, and other systems can include the semiconductor apparatus 1.

The communication system shown in FIG. 10 includes first and second paths. The first path includes an antenna 30, a first-stage amplifier 31, a gain-stage amplifier 32, a frequency converter 33, and buffers 34 and 46. The second path includes an antenna 40, a first-stage amplifier 41, a gain-stage amplifier 42, a frequency converter 43, and buffers 44 and 46. The communication system shown in FIG. 10 also includes a path selector 35 which is disposed subsequent to the buffers 34 and 44, as well as an oscillator 45 that generates a signal used in a frequency conversion process.

Substantially the same process is performed in the first and second paths. Hereafter, using the first path as an example, an operation of the communication system of FIG. 10 will be described. This communication system receives a signal having a frequency of several tens of GHz via the antenna 30. The signal received by the antenna 30 is small in amplitude and thus amplified by the first-stage amplifier 31. Subsequently, the gain-stage amplifier 32 amplifies the amplitude of the signal outputted by the first-stage amplifier 31. Subsequently, the frequency converter 33 frequency-converts the signal of several tens of GHz into a signal of 1 to 2 GHz using a signal outputted by the oscillator 45, and outputs the resulting signal. Subsequently, the communication system outputs the signal outputted by the frequency converter 33 via the two buffers. In this communication system, the buffers are disposed before and after the path selector 35 so that the path selector 35 can select one of the option of outputting the signal received by the antenna 30 as an output signal of the first path and the option of outputting that signal as an output signal of the second path. If the path selector 35 is not provided, a single buffer may be provided.

Figure 11:
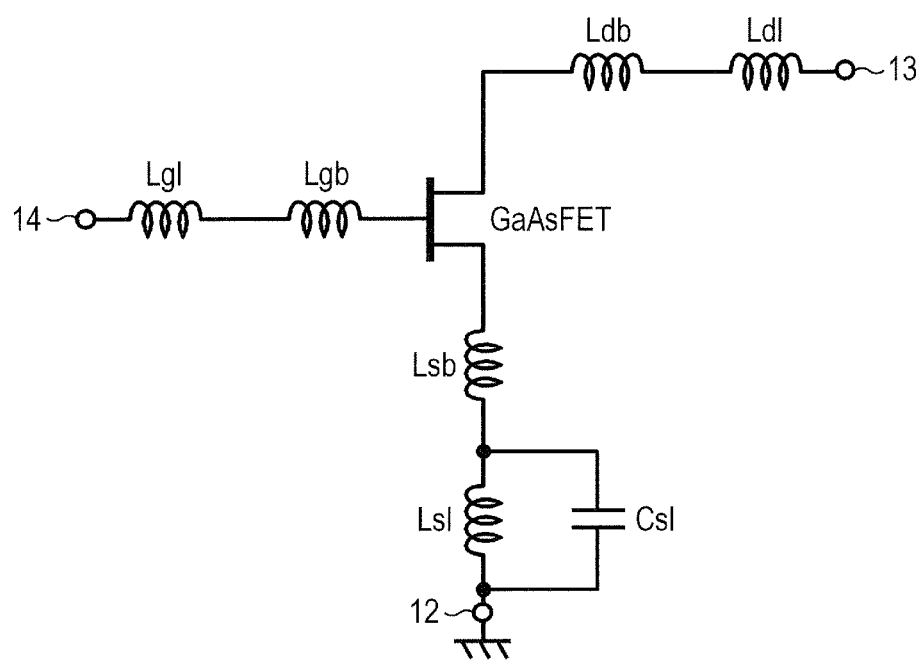
FIG. 11 is an equivalent circuit diagram of the semiconductor apparatus according to the first embodiment.

The communication system shown in FIG. 10 includes the semiconductor apparatuses 1 according to the first embodiment as the first-stage amplifiers 31 and 41. More specifically, the semiconductor apparatuses 1 serve as source ground circuits, which are components of amplifier circuits. FIG. 11 is a circuit diagram in a case where the semiconductor apparatus 1 is used as a source ground circuit. More specifically, FIG. 11 is an equivalent circuit diagram of the semiconductor apparatus 1 including the parasitic inductance of the bonding wire 11, the parasitic inductance of the lead frame, and a capacitor realized by the high-dielectric layer 16.

As shown in FIG. 11, the semiconductor apparatus 1 includes a GaAsFET. The source of the GaAsFET is coupled to the source electrode lead 12, the drain thereof to the drain electrode lead 13, and the gate thereof to the gate electrode lead 14. At this time, the bonding wire 11 and the lead frame each have a parasitic inductance. In the equivalent circuit diagram shown in FIG. 11, the parasitic inductance of the bonding wire 11 coupled to the source of the GaAsFET is represented by Lsb, and the parasitic inductance of the source electrode lead 12 by Lsl. The parasitic inductance of the bonding wire 11 coupled to the drain of the GaAsFET is represented by Ldb, and the parasitic inductance of the drain electrode lead 13 by Ldl. The parasitic inductance of the bonding wire 11 coupled to the gate of the GaAsFET is represented by Lgb, and the parasitic inductance of the gate electrode lead 14 by Lgl.

In FIG. 11, the capacitor realized by the high-dielectric layer 16 is represented by a capacitor Csl. The capacitor Csl uses the high-dielectric layer 16 as a dielectric layer and also uses the source electrode lead 12 as one electrode and the first source wiring 20 of the substrate 23 as the other electrode.

As shown in FIG. 11, in the semiconductor apparatus 1, the parasitic inductances Lsb and Lsl are coupled in series between the source of the GaAsFET and the ground terminal, and the parasitic inductance Lsl and the capacitor Csl are coupled in parallel therebetween. The parasitic inductances Ldb and Ldl are coupled in series between the drain of the GsAsFET and the drain electrode lead 13. The parasitic inductances Lgb and Lgl are coupled in series between the gate of the GaAsFET and the gate electrode lead 14.

Next, an operation of the semiconductor apparatus 1 according to the first embodiment will be described. The semiconductor apparatus 1 according to the first embodiment receives a signal received by the antenna 30 via the gate electrode lead 14. The received signal is amplified and then outputted via the drain electrode lead 13. At this time, the semiconductor apparatus 1 has a characteristic that the amplification factor decreases as the impedance between the source of the GaAsFET and the ground terminal increases. At this time, the inductance has a characteristic that the impedance increases as the frequency of a given signal increases, and the capacitor has a characteristic that the impedance decreases as the frequency of a given signal increases. In the semiconductor apparatus 1 according to the first embodiment, the parasitic inductance Lsl and the capacitor Csl are coupled in parallel. Thus, even when an increase in the frequency of a received signal increases the impedance of the parasitic inductance Lsl, the semiconductor apparatus 1 according to the first embodiment can maintain the impedance of the source at a low level using the capacitor Csl.

Figure 12:
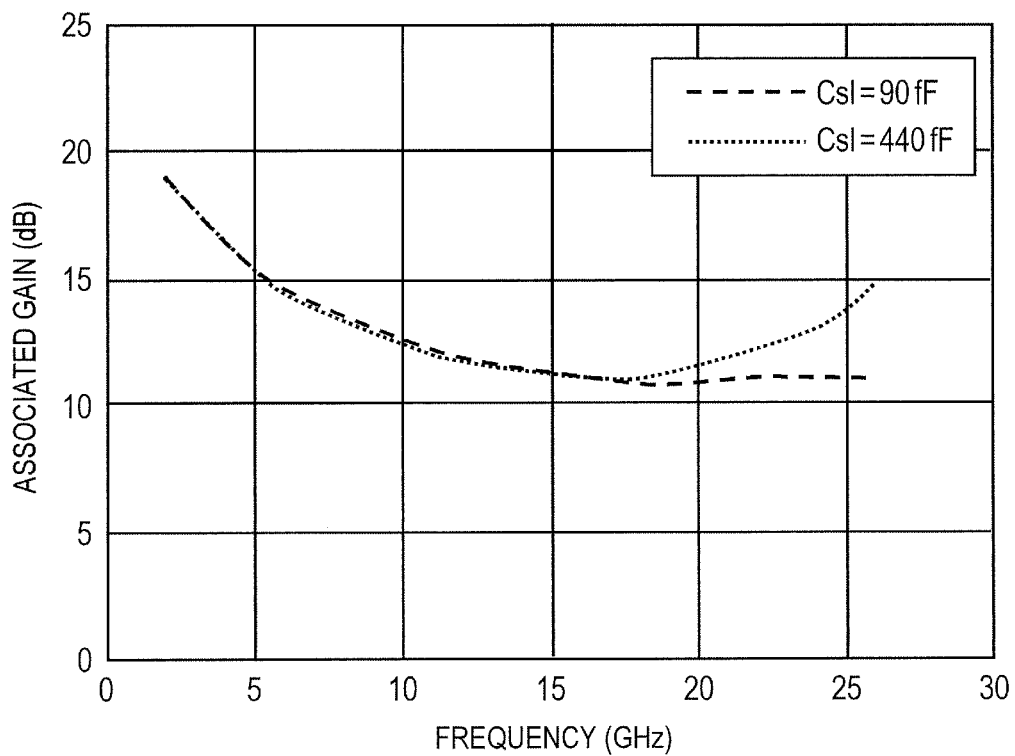
FIG. 12 is a graph showing an example of frequency characteristics of the semiconductor apparatus according to the first embodiment.

Referring to FIG. 12, frequency characteristics of a source ground circuit formed using the semiconductor apparatus 1 according to the first embodiment will be described. FIG. 12 shows an example of frequency characteristics of a source ground circuit including a capacitor Csl having a capacitance of 90 fF and frequency characteristics of a source ground circuit including a capacitor Csl having a capacitance of 440 fF.

As is understood from FIG. 12, for the capacitor Csl having a capacitance of 90 fF, the associated amplification factor decreases in a frequency band of 15 GHz or more. On the other hand, for the capacitor Csl having a capacitance of 440 fF, the associated amplification factor increases in a frequency band of 15 GHz or more. That is, it is possible to improve high-frequency characteristics by properly setting the relative permittivity of the high-dielectric layer 16 and the size of the dielectric chip in the semiconductor apparatus 1 according to the first embodiment.

Figure 13:
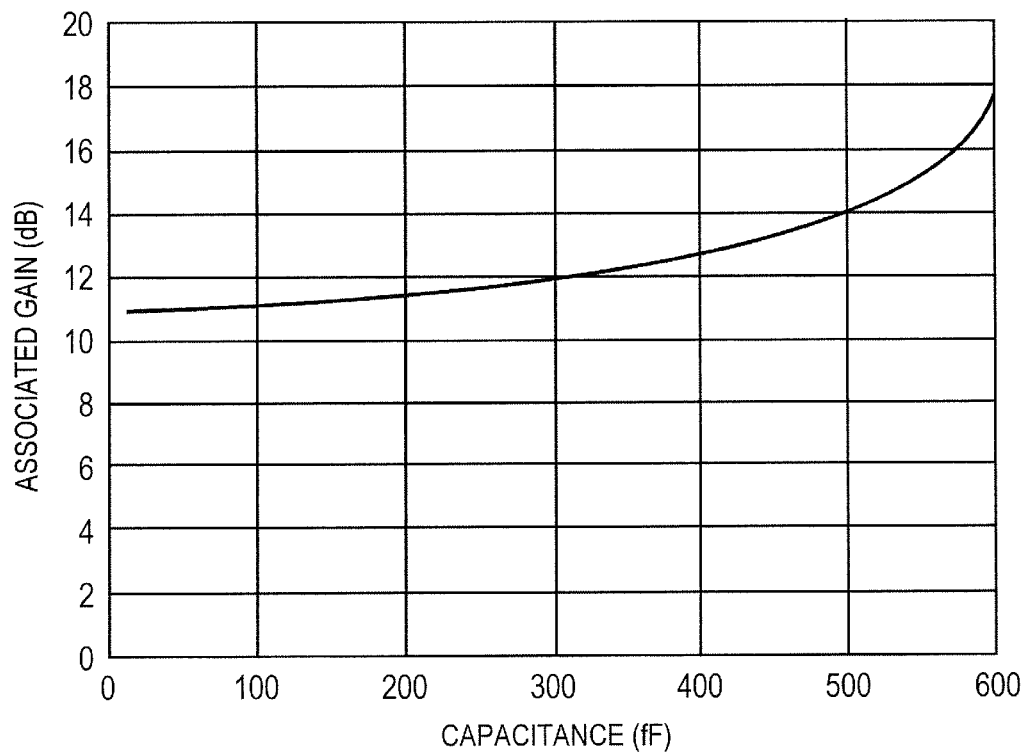
FIG. 13 is a graph showing capacitance versus associated gain characteristics of the semiconductor apparatus according to the first embodiment.

FIG. 13 is a graph showing capacitance versus associated gain characteristics of the capacitor Csl when the frequency of an inputted signal is 24 GHz. As shown in FIG. 13, in the semiconductor apparatus 1, after the capacitance of the capacitor Csl exceeds 400 fF, a curve representing an increase in associated gain with respect to a signal of 24 GHz becomes steeper. That is, in the semiconductor apparatus 1, the associated gain in a high frequency band can increase as the capacitance of the capacitor Csl composed of the high-dielectric layer 16 increases.

Figure 14:
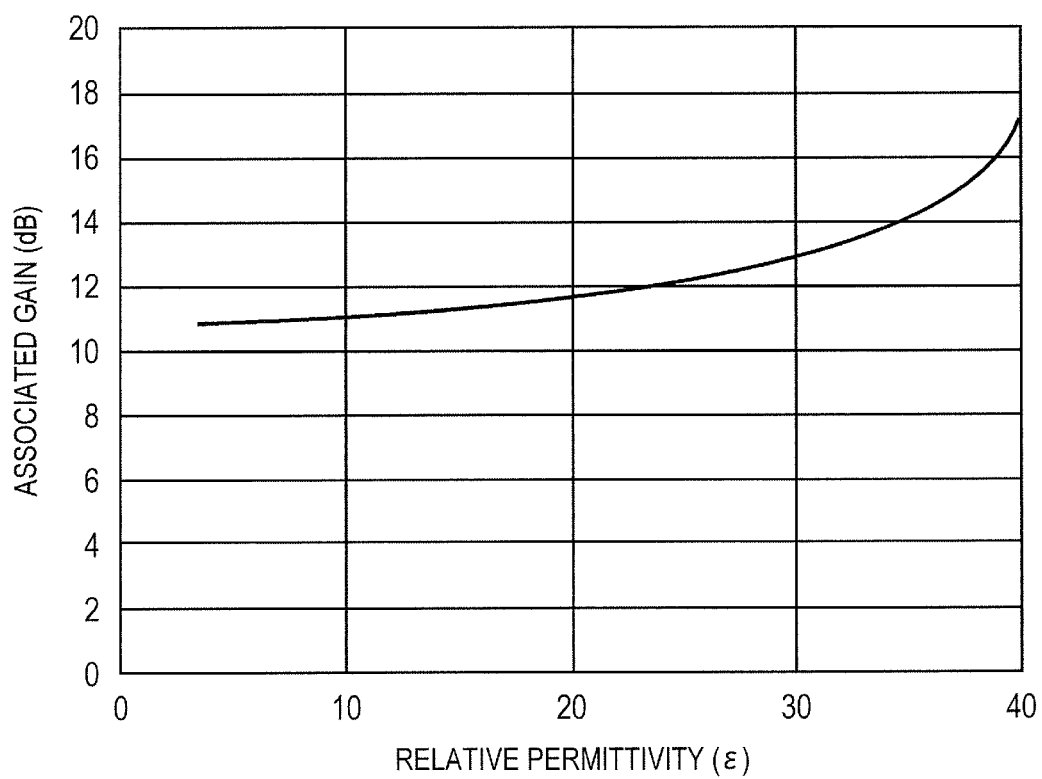
FIG. 14 is a graph showing relative permittivity versus associated gain characteristics of a high-dielectric layer in the semiconductor apparatus according to the first embodiment.

FIG. 14 is a graph showing relative permittivity versus associated gain characteristics of the semiconductor apparatus 1 when the frequency of an inputted signal is 24 GHz; the sizes of the dielectric chip serving as the high-dielectric layer 16 are a width 0.5 mm, a length 0.5 mm, and a height 0.3 mm; and the source electrode lead 12 and the first source wiring 20 are coupled to the dielectric chip. Assuming that the width, length, and height of the dielectric chip are all constant, the capacitance of the capacitor Cs1 increases as the relative permittivity increases, that is, there is a proportionality therebetween. For this reason, as shown in FIG. 14, in the semiconductor apparatus 1, a curve representing an increase in associated gain becomes steeper after the relative permittivity exceeds 25.

As described above, the semiconductor apparatus 1 according to the first embodiment has the high-dielectric layers 16 over the back surface of the source electrode lead 12 coupled to the source of the GaAsFET formed over the semiconductor chip 10. Each high-dielectric layer 16 forms a capacitor Cs1 that uses the source electrode lead 12 as one electrode and the first source wiring 20 coupled to the source electrode lead 12 as the other electrode. Each capacitor Cs1 is coupled in parallel to the parasitic inductance Ls1 of the source electrode lead 12. Thus, the semiconductor apparatus 1 according to the first embodiment can increase the associated gain with respect to a signal having a high frequency. Further, since the semiconductor apparatus 1 according to the first embodiment does not include a resonant circuit, it can maintain the stability of the source ground circuit in a wide frequency band.

In the semiconductor apparatus 1 according to the first embodiment, the high-dielectric layers 16 are disposed only over the back surface of the source electrode lead 12. Since the high-dielectric layers 16 are formed only over parts of the source electrode lead 12 in this way, the value of a parasitic capacitance formed between the lead terminals can be reduced. By controlling the parasitic capacitance between the lead terminals in this way, the semiconductor apparatus 1 can prevent the degradation of high-frequency characteristics.

In the semiconductor apparatus 1 according to the first embodiment, the dielectric chips to serve as the high-dielectric layers 16 are fixed to the source electrode lead 12 using an adhesive and then the resin mold 15 is formed. That is, since a package is formed using the resin mold 15 in the semiconductor apparatus 1 according to the first embodiment, the manufacturing process can be simplified. The resin mold 15 is easier to process than a package including ceramics. In addition, the material cost thereof is low. That is, by forming a package including the resin mold 15, manufacturing cost can be reduced.

The semiconductor apparatus 1 according to the first embodiment includes the cap 17 as the top portion of the package. Thus, the semiconductor apparatus 1 according to the first embodiment can be realized as a hollow package. Use of a hollow package prevents the semiconductor chip 10 and the bonding wires 11 from directly contacting the resin. Thus, the parasitic capacitances of the semiconductor chip 10 and the bonding wires 11 can be reduced. Since the parasitic capacitances are reduced in this way, it is possible to achieve the semiconductor apparatus 1 having good amplification characteristics even in a high frequency band.

In the semiconductor apparatus 1 according to the first embodiment, the cap 17 is made of a resin material. Resin materials have insulation characteristics. This can prevent formation of a parasitic capacitor that uses the semiconductor chip 10 and the bonding wires 11 as one terminal and the cap 17 as the other terminal, as well as uses air as a dielectric.

Second Embodiment

Figure 15:
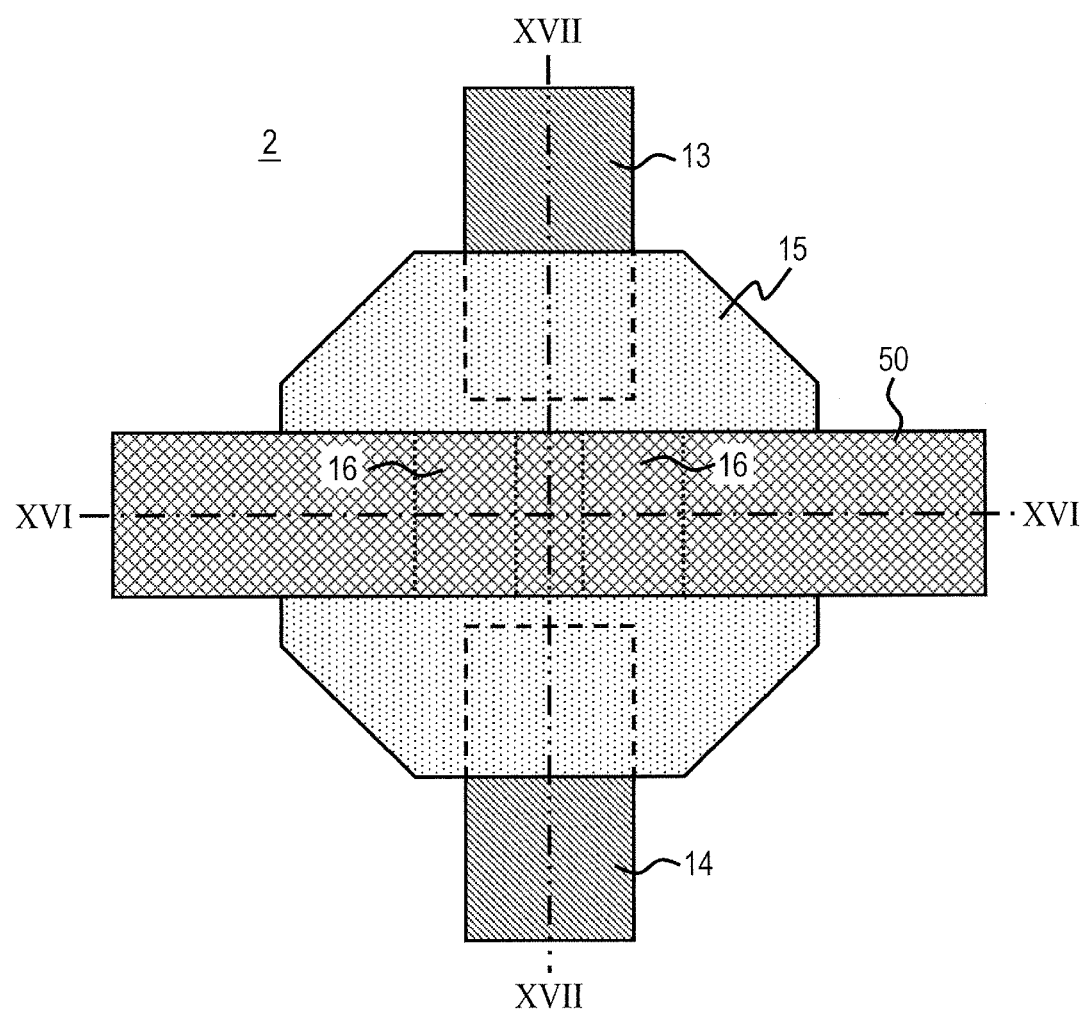
FIG. 15 is a bottom view of a semiconductor apparatus according to a second embodiment.

In a second embodiment, a plate equivalent to the first source wiring 20 formed over the substrate 23 according to the first embodiment is disposed in a semiconductor apparatus. FIG. 15 is a bottom view of a semiconductor apparatus 2 according to a second embodiment. The top view of the semiconductor apparatus 2 is the same as the semiconductor apparatus 1 according to the first embodiment and therefore will not be described. As shown in FIG. 15, the semiconductor apparatus 2 according to the second embodiment includes an additional source electrode plate 50 that couples one end and the other end of the source electrode lead 12.

Figure 16:
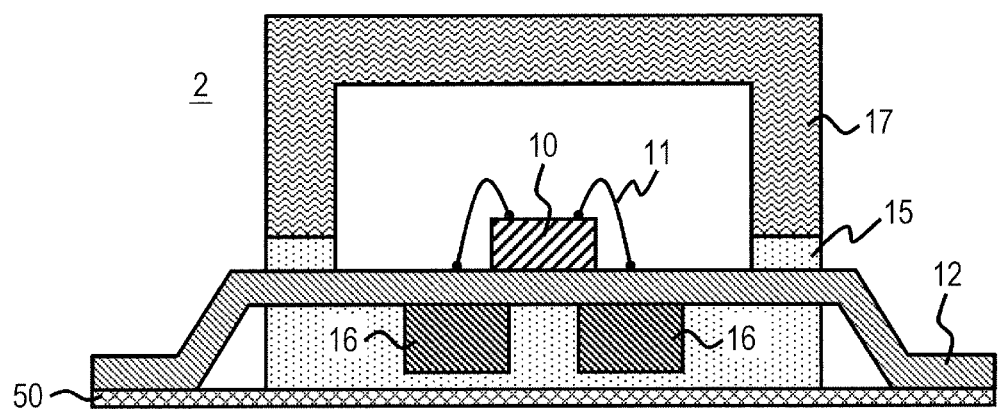
FIG. 16 is a sectional view of the semiconductor apparatus according to the second embodiment when seen from a first direction.
Figure 17:
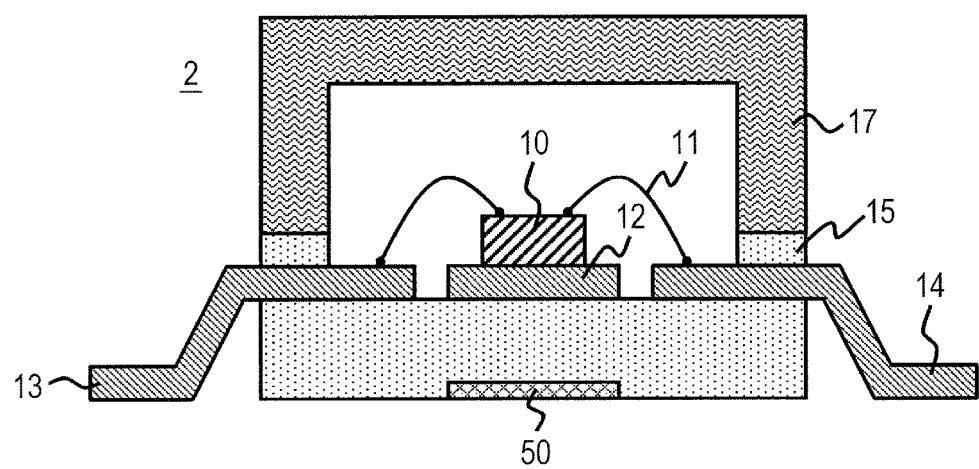
FIG. 17 is a sectional view of the semiconductor apparatus according to the second embodiment when seen from a second direction.

FIG. 16 is a sectional view of the semiconductor apparatus 2 taken along line XVI-XVI of FIG. 15. As shown in FIG. 16, the additional source electrode plate 50 is formed so as to couple one end and the other end of the source electrode lead 12 and the bottom surface of the resin mold 15. FIG. 17 is a sectional view of the semiconductor apparatus 2 taken along line XVII-XVII of FIG. 15. Of the surfaces of the high-dielectric layers 16, the surfaces opposed to the lead frame are referred to as first surfaces, and the surfaces opposite to the first surfaces are referred to as second surfaces. As shown in FIG. 17, the additional source electrode plate 50 is formed so as to be opposed to the second surfaces. Further, the additional source electrode plate 50 is coupled to both ends of the source electrode lead 12.

Since the additional source electrode plate 50 is disposed in this way, there is formed a capacitor Cs1 that uses the source electrode lead 12 as one terminal and the additional source electrode plate 50 as the other terminal, as well as uses the high-dielectric layers 16 as dielectric layers.

Figure 18:
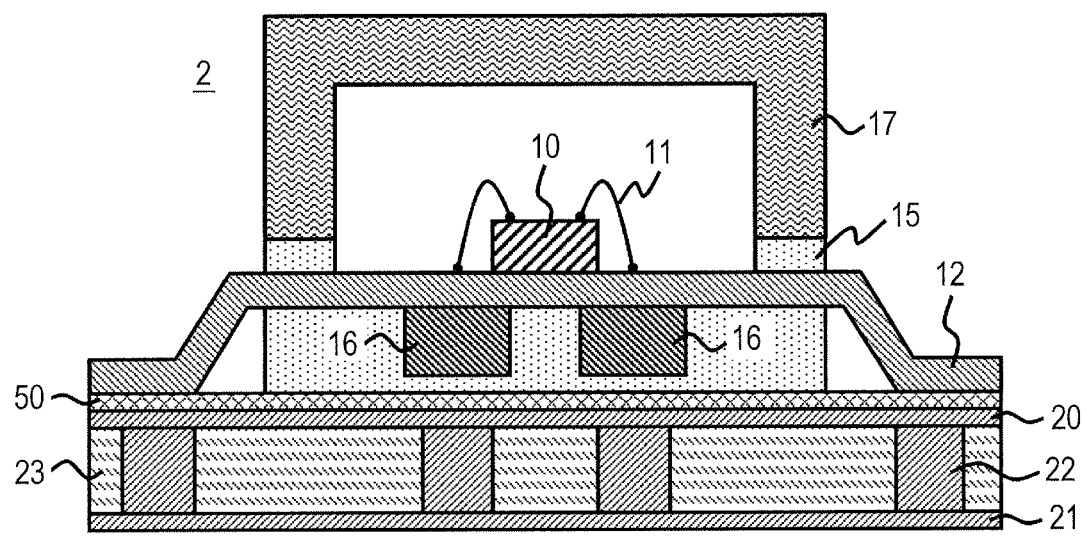
FIG. 18 is a sectional view of the semiconductor apparatus according to the second embodiment which is mounted over a substrate.

FIG. 18 is a sectional view showing a mounting state of the semiconductor apparatus 2 according to the second embodiment. As shown in FIG. 18, when the semiconductor apparatus 2 is mounted, the first source wiring 20 is formed so as to be continuous between one end and the other end of the source electrode lead 12, as in the first embodiment. Since the additional source electrode plate 50 serves as the other electrode of the capacitor Cs1 in the semiconductor apparatus 2 according to the second embodiment, the first source wiring 20 need not necessarily be continuous one-piece wiring. However, to reduce the impedance of the source wiring as much as possible, it is preferable to form the first source wiring 20 as continuous wiring and form the through holes 22 below the high-dielectric layers 16.

Since the semiconductor apparatus 2 according to the second embodiment includes the additional source electrode plate 50 as described above, the flexibility of the configuration of the first source wiring 20 can be increased. Further, in the semiconductor apparatus 2 according to the second embodiment, even when the first source wiring 20 is formed as separated pieces of wiring over the existing substrate 23, the additional source electrode plate 50 can serve as the other terminal of the capacitor Cs1. Even in this case, the semiconductor apparatus 2 according to the second embodiment can increase high-frequency characteristics, as in the first embodiment.

Third Embodiment

Figure 19:
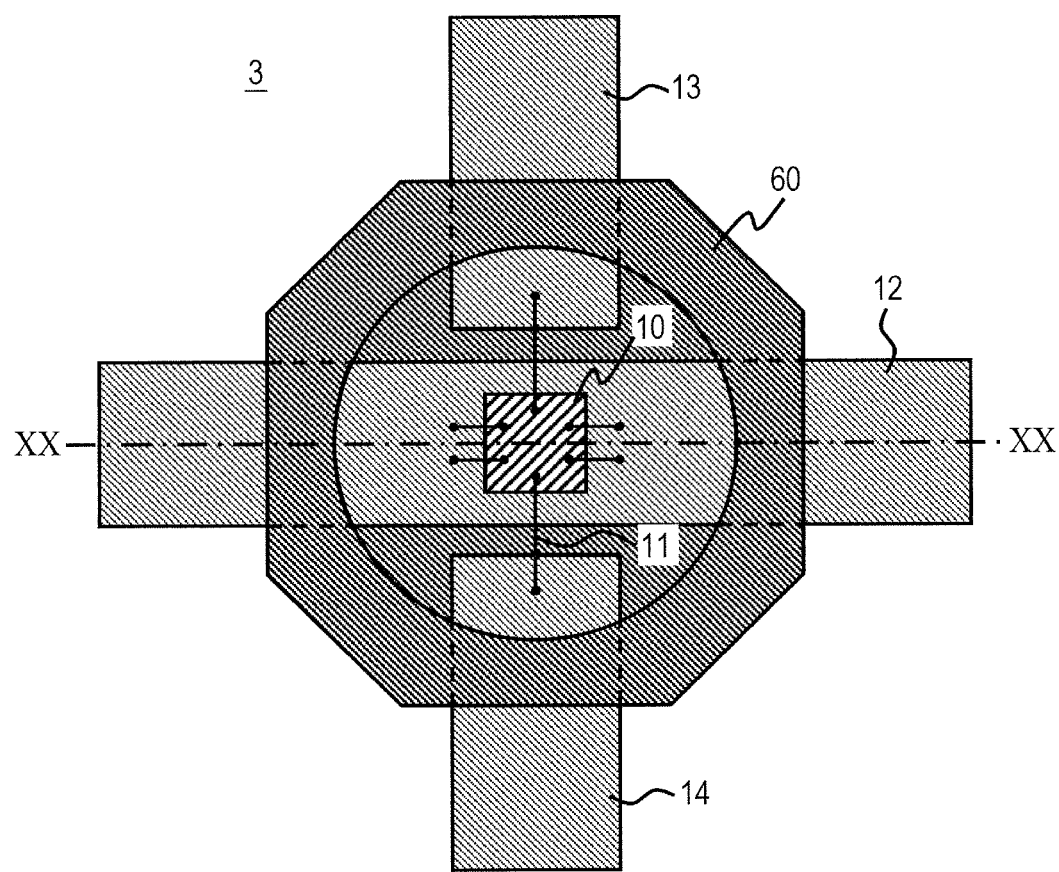
FIG. 19 is a top view of a semiconductor apparatus according to a third embodiment.

In a third embodiment, a resin mold is formed as a high-dielectric layer rather than using a dielectric chip. FIG. 19 shows a top view of a semiconductor apparatus 3 according to a third embodiment. As shown in FIG. 19, the semiconductor apparatus 3 according to the third embodiment has the same shape as the semiconductor apparatus 1 according to the first embodiment. However, the semiconductor apparatus 3 includes a resin mold 60 rather than the resin mold 15 of the semiconductor apparatus 1 according to the first embodiment.

Figure 20:
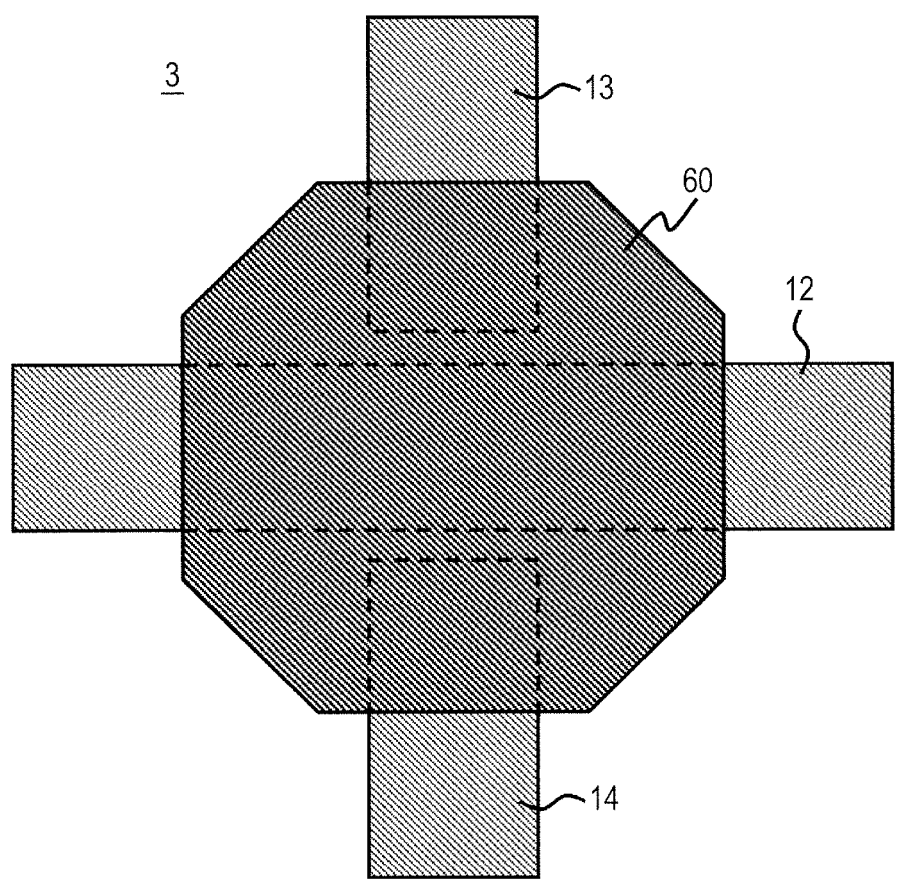
FIG. 20 is a bottom view of the semiconductor apparatus according to the third embodiment.

FIG. 20 is a bottom view of the semiconductor apparatus 3 according to the third embodiment. As shown in FIG. 20, the semiconductor apparatus 3 according to the third embodiment has the same shape as the semiconductor apparatus 1 according to the first embodiment. However, the semiconductor apparatus 3 includes the resin mold 60 rather than the resin mold 15 of the semiconductor apparatus 1 according to the first embodiment.

Figure 21:
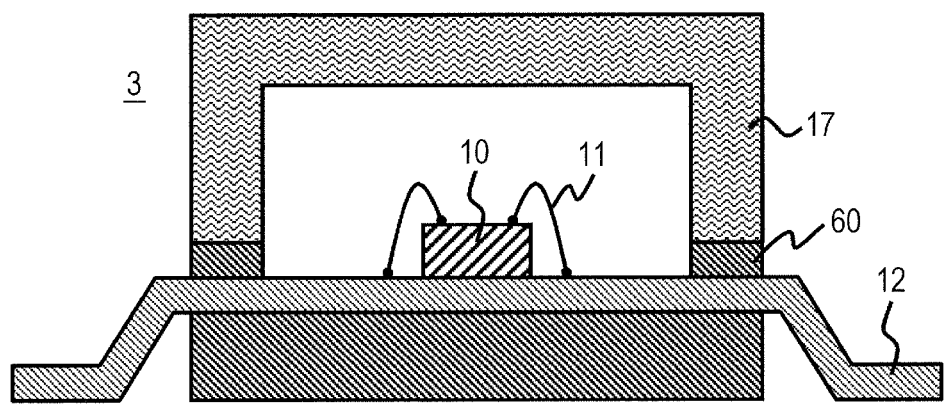
FIG. 21 is a sectional view of the semiconductor apparatus according to the third embodiment.

FIG. 21 shows a sectional view of the semiconductor apparatus 3 according to the third embodiment. As shown in FIG. 21, the semiconductor apparatus 3 according to the third embodiment has the same shape as the semiconductor apparatus 1 according to the first embodiment. However, the semiconductor apparatus 3 does not include the high-dielectric layers 16 of the semiconductor apparatus 1 according to the first embodiment. Further, the semiconductor apparatus 3 includes the resin mold 60 rather than the resin mold 15 of the semiconductor apparatus 1.

Figure 22:
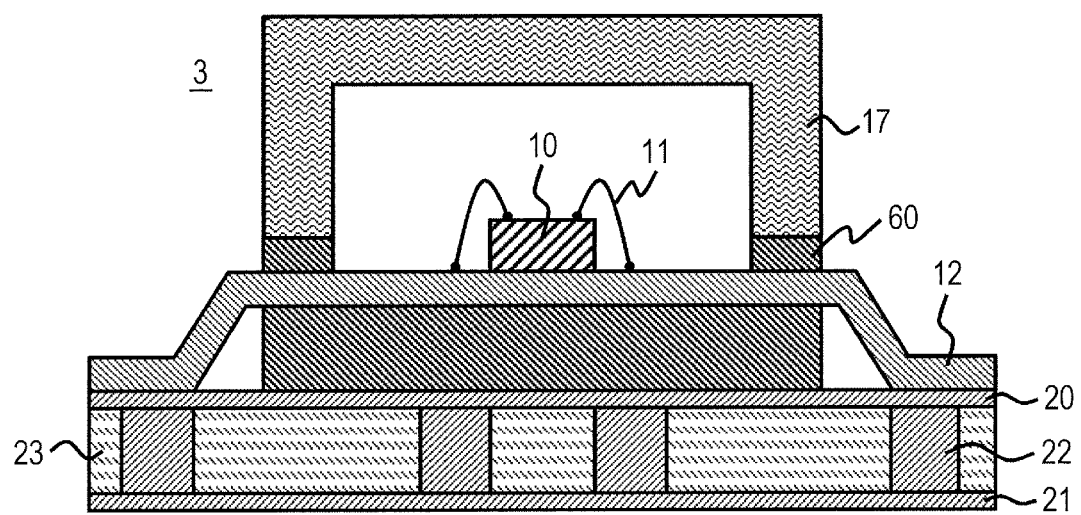
FIG. 22 is a sectional view of the semiconductor apparatus according to the third embodiment which is mounted over a substrate.

FIG. 22 is a sectional view showing a mounting state of the semiconductor apparatus 3 according to the third embodiment. As shown in FIG. 22, the mounting state of the semiconductor apparatus 3 according to the third embodiment is substantially the same as that of the semiconductor apparatus 1 according to the first embodiment. However, to reduce the impedance of the source wiring as much as possible, it is preferred to form the through holes 22 of the substrate 23 according to the third embodiment in such a manner that the through holes 22 are located below the first and second wire junctions over the source electrode lead 12.

While the resin mold 60 is formed by solidifying $SiO_2$ particles using an epoxy or the like as in the first embodiment, it has a higher $SiO_2$ content than the resin mold 15. Increasing the $SiO_2$ content allows the relative permittivity to be increased to about 10. The resin mold 60 preferably has a higher relative permittivity than that of the cap 17.

Figure 23:
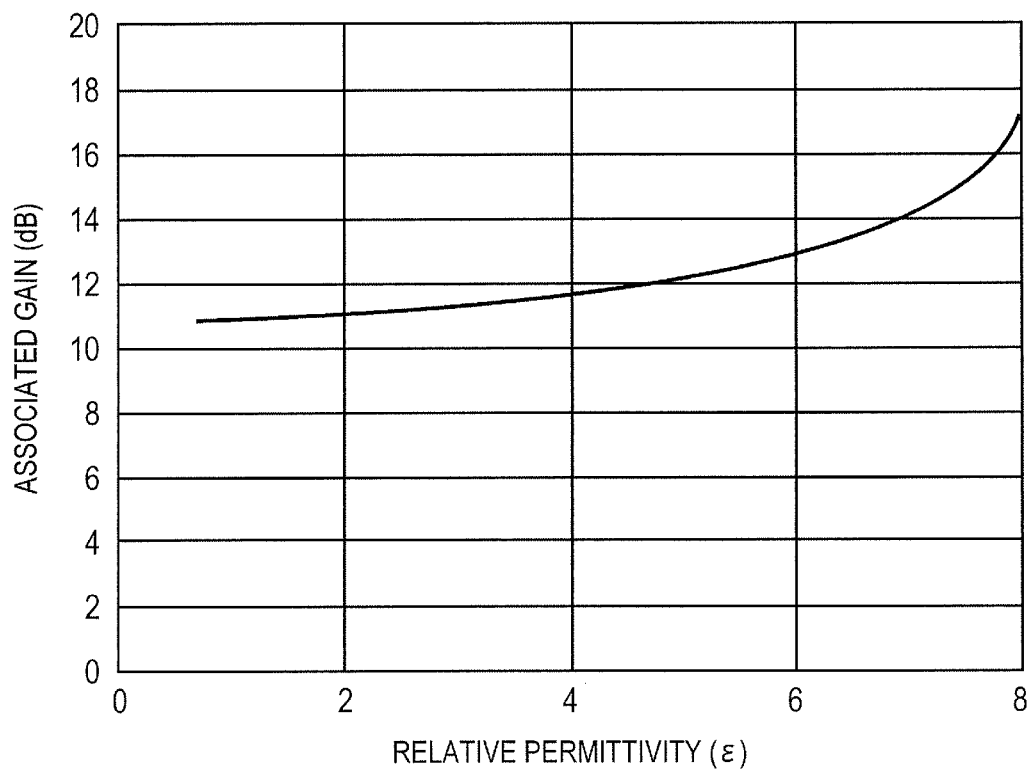
FIG. 23 is a graph showing relative permittivity versus associated gain characteristics of a high-dielectric layer in the semiconductor apparatus according to the third embodiment.

FIG. 23 is a graph showing relative permittivity versus associated gain characteristics of the semiconductor apparatus 3 when the frequency of an input signal is 24 GHz; the width of the area where the resin mold 60, and the source electrode lead 12 and the first source wiring 20 are opposed to each other is 0.65 mm; the length is 2.0 mm; and the distance between the source electrode lead 12 and the first source wiring 20 is 0.3 mm. As shown in FIG. 23, in the semiconductor apparatus 3, a curve representing an increase in associated gain becomes steeper after the relative permittivity exceeds 5.

As described above, forming the resin mold 60 as a high-dielectric layer allows an increase in the area where the dielectric layer, and the source electrode lead 12 and the first source wiring 20 are opposed to each other. For this reason, even when the relative permittivity of the high-dielectric layer is the same, a capacitor Cs1 having a higher capacitance can be formed in the semiconductor apparatus 3 according to the third embodiment. Further, there is no need to bond dielectric chips to the source electrode lead in the semiconductor apparatus 3 according to the third embodiment. As a result, the first manufacturing process shown in FIG. 6 can be omitted.

The present invention is not limited to the above-mentioned embodiments, and changes can be made to the embodiments as appropriate without departing from the spirit and scope of the invention.

What is claimed is:

1. A semiconductor apparatus comprising:
a semiconductor chip;
a lead having first and second surfaces, the first surface having the semiconductor chip mounted thereover, the second surface being opposite to the first surface;
a bonding wire that couples the semiconductor chip and the lead;
a resin base that supports part of the lead from the second surface; and
a high dielectric constant layer having a relative permittivity of 5 or more,
wherein the lead includes a source electrode lead and a source-wire junction, the source electrode lead being coupled to a source of a semiconductor device formed over the semiconductor chip, the source-wire junction being a junction at which the source electrode lead and the bonding wire are coupled together, and
wherein the high dielectric constant layer is disposed in a region over the second surface of the lead, the region including at least a position corresponding to the source-wire junction, and surrounded by the base.

2. The semiconductor apparatus according to claim 1, wherein the high dielectric constant layer includes one of a metal oxide and a silicon oxide.

3. The semiconductor apparatus according to claim 1, further comprising a cap that covers the semiconductor chip and includes a resin having a permittivity lower than that of the high dielectric constant layer.

4. The semiconductor apparatus according to claim 1,
wherein the source-wire junction includes first and second source-wire junctions which are disposed in separate positions, and
wherein the high dielectric constant layer includes a first high dielectric constant layer corresponding to the first source-wire junction and a second high dielectric constant layer corresponding to the second source-wire junction.

5. The semiconductor apparatus according to claim 1, wherein the lead further includes a drain electrode lead coupled to a drain of the semiconductor device formed over the semiconductor chip, and a gate electrode lead coupled to a gate of the semiconductor device formed over the semiconductor chip.

6. The semiconductor apparatus according to claim 1,
wherein the high dielectric constant layer has a first surface opposed to the lead and a second surface opposite to the first surface,
the semiconductor apparatus further comprising an additional source electrode plate formed in a position opposed to the second surface and coupled to the source electrode lead.

7. The semiconductor apparatus according to claim 1, wherein the high dielectric constant layer is in the form of one of a dice and a chip.

8. The semiconductor apparatus according to claim 1, wherein the high dielectric constant layer includes many particles and distributed in the base.

* * * * *